United States Patent
Suzuki et al.

(10) Patent No.: US 10,181,515 B2
(45) Date of Patent: Jan. 15, 2019

(54) SEMICONDUCTOR DEVICE

(71) Applicant: Kabushiki Kaisha Toshiba, Minato-ku (JP)

(72) Inventors: Mariko Suzuki, Yokohama (JP); Tadashi Sakai, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/436,179

(22) Filed: Feb. 17, 2017

(65) Prior Publication Data

US 2017/0345899 A1 Nov. 30, 2017

(30) Foreign Application Priority Data

May 30, 2016 (JP) .................. 2016-107939

(51) Int. Cl.
*H01L 29/16* (2006.01)
*H01L 29/47* (2006.01)
*H01L 29/40* (2006.01)
*H01L 29/872* (2006.01)
*H01L 29/36* (2006.01)
(Continued)

(52) U.S. Cl.
CPC ........ *H01L 29/1602* (2013.01); *H01L 23/291* (2013.01); *H01L 23/3171* (2013.01); *H01L 29/0657* (2013.01); *H01L 29/1608* (2013.01); *H01L 29/36* (2013.01); *H01L 29/402* (2013.01); *H01L 29/404* (2013.01); *H01L 29/47* (2013.01); *H01L 29/6603* (2013.01); *H01L 29/66037* (2013.01); *H01L 29/66234* (2013.01); *H01L 29/732* (2013.01); *H01L 29/868* (2013.01); *H01L 29/8613* (2013.01); *H01L 29/872* (2013.01); *H01L 29/66272* (2013.01)

(58) Field of Classification Search
None
See application file for complete search history.

(56) References Cited

U.S. PATENT DOCUMENTS 5,474,021 A * 12/1995 Tsuno .................. C30B 25/02
  117/101
5,492,770 A * 2/1996 Kawarada ............ C23C 16/029
  428/539.5

(Continued)

FOREIGN PATENT DOCUMENTS

JP 2011-181763 9/2011
JP 5099486 12/2012
(Continued)

*Primary Examiner* — Angel Roman
(74) *Attorney, Agent, or Firm* — Oblon, McClelland, Maier & Neustadt, L.L.P.

(57) ABSTRACT

Provided is a semiconductor device according to an embodiment including an i-type or first-conductivity-type first diamond semiconductor layer having a first side surface, a second-conductivity-type second diamond semiconductor layer provided on the first diamond semiconductor layer and having a second side surface, a third diamond semiconductor layer being in contact with the first side surface and the second side surface, the third diamond semiconductor containing nitrogen, a first electrode electrically connected to the first diamond semiconductor layer, and a second electrode electrically connected to the second diamond semiconductor layer.

15 Claims, 6 Drawing Sheets

(51) Int. Cl.
*H01L 23/29* (2006.01)
*H01L 23/31* (2006.01)
*H01L 29/66* (2006.01)
*H01L 29/732* (2006.01)
*H01L 29/861* (2006.01)
*H01L 29/868* (2006.01)
*H01L 29/06* (2006.01)

(56) References Cited

U.S. PATENT DOCUMENTS

| | | | |
|---|---|---|---|
| 5,600,156 A * | 2/1997 | Nishibayashi | H01L 29/1602 |
| | | | 257/104 |
| 9,246,305 B1 * | 1/2016 | Kub | H01S 5/02484 |
| 9,589,897 B1 * | 3/2017 | Wu | H01L 23/53266 |
| 2011/0247929 A1 * | 10/2011 | Nagai | C02F 1/46109 |
| | | | 204/290.15 |
| 2015/0060885 A1 * | 3/2015 | Suzuki | H01L 29/1602 |
| | | | 257/77 |

FOREIGN PATENT DOCUMENTS

| | | |
|---|---|---|
| JP | 2015-50393 | 3/2015 |
| JP | 2017-147286 A | 8/2017 |

\* cited by examiner

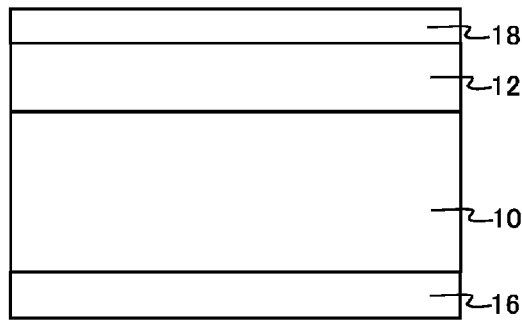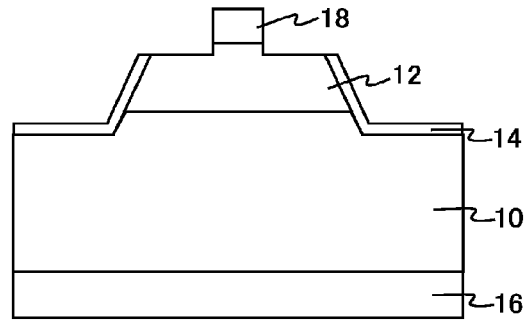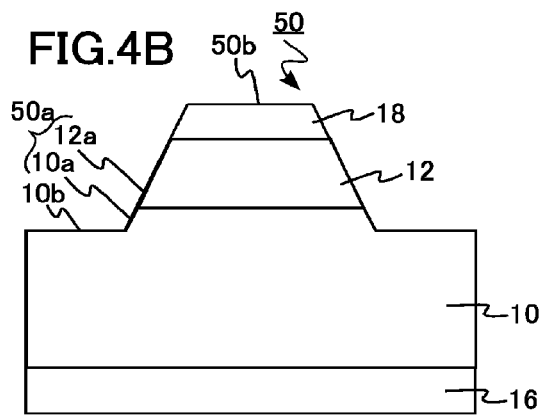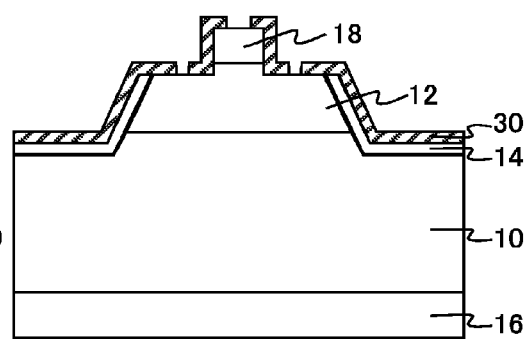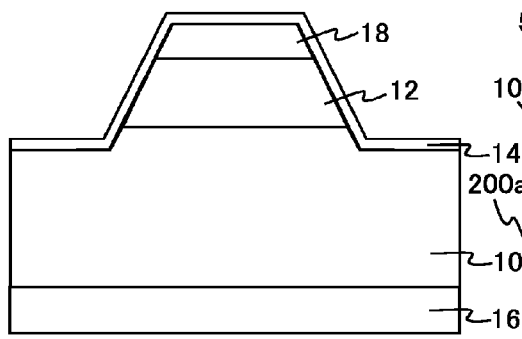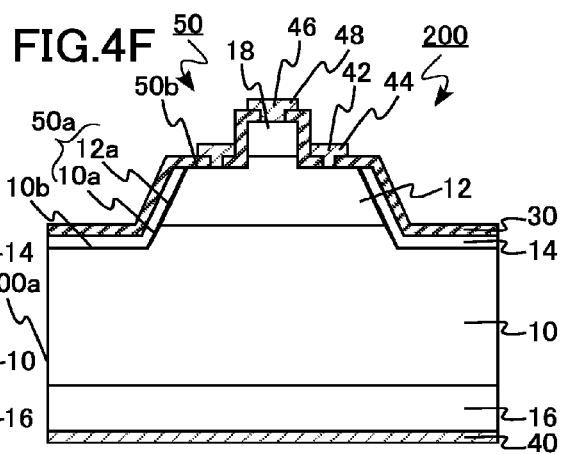

though being based upon and claims the benefit of
SEMICONDUCTOR DEVICE

CROSS-REFERENCE TO RELATED APPLICATION

This application is based upon and claims the benefit of priority from Japanese Patent Application No. 2016-107939, filed on May 30, 2016, the entire contents of which are incorporated herein by reference.

FIELD

Embodiments described herein relate generally to a semiconductor device.

BACKGROUND

A diamond semiconductor is a wide bandgap semiconductor having a large band gap energy of 5.5 eV. The diamond semiconductor is strong and has excellent material properties such as a high carrier mobility (electron: 4500 cm²/V·sec, hole: 3800 cm²/V·sec) and a high breakdown field strength (10 MV/cm) as well as a high thermal conductivity (20 W/cm·K). Therefore, the diamond semiconductors have excellent characteristics as a material for a semiconductor device having ultra-high breakdown voltage/ultra-high efficiency.

So far, power devices using diamond semiconductors have been actively developed.

BRIEF DESCRIPTION OF THE DRAWINGS

FIGS. 4A to 4F are schematic cross-sectional diagrams illustrating a method of manufacturing the semiconductor device of the second embodiment;

DETAILED DESCRIPTION

Figure 1:
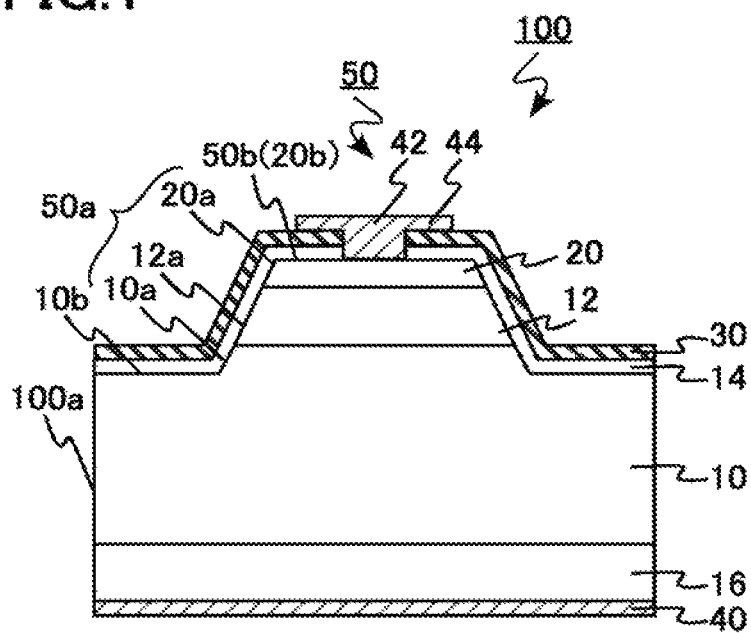
FIG. 1 is a schematic cross-sectional diagram of a semiconductor device according to a first embodiment.

Hereinafter, embodiments of the present invention will be described with reference to the drawings. Similar components are denoted by the same reference numeral. The drawings are schematic or conceptual, and relationships between thickness and width of portions, proportional coefficients of sizes among portions, and the like are not necessarily the same as actual values. Furthermore, even in the case of indicating the same portion, there may be cases where the dimensions and proportional coefficients may be illustrated differently among the drawings.

In this specification, the same or similar components are denoted by the same reference numerals, and redundant description may be omitted.

Hereinafter, the case where the first conductivity type is a p type and the second conductivity type is an n type will be described as an example. In addition, even if the first conductivity type is an n type and the second conductivity type is a p type, the semiconductor device of the embodiment described in this specification can be preferably implemented. In the description hereinafter, the notations $n^+$, n, $n^-$ and $p^+$, p, $p^-$ represent relative heights of impurity concentration in respective conductivity types. Namely, denotes that is relatively higher than n in n-type impurity concentration, and $n^-$ denotes that $n^-$ is relatively lower than n in n-type impurity concentration. In addition, $p^+$ denotes that $p^+$ is relatively higher than p in p-type impurity concentration, and $p^-$ denotes that $p^-$ is relatively lower than p in p-type impurity concentration. In addition, in some cases, the $n^+$ type and the $n^-$ type are simply referred to as an n type, and the $p^+$ type and the $p^-$ type are simply referred to as a p type.

In this specification, an i-type semiconductor (undoped semiconductor) denotes an intrinsic semiconductor. Herein, the intrinsic semiconductor denotes a semiconductor having an n-type impurity concentration and a p-type impurity concentration of $1 \times 10^{15}$ cm$^{-3}$ or less.

In the specification, in order to indicate positional relationships of parts and the like, the upward direction in the drawing is described as "upper" and the downward direction in the drawing is described as "lower". In the specification, the concepts "upper" and "lower" are not necessarily terms indicating the relationship with the direction of gravity. Embodiments described hereinafter can be implemented in a direction different from the direction illustrated or described hereinafter.

First Embodiment

A semiconductor device according to the embodiment is configured to include an i-type or first-conductivity-type first diamond semiconductor layer having a first side surface, a second-conductivity-type second diamond semiconductor layer provided on the first diamond semiconductor layer and having a second side surface, a third diamond semiconductor layer being in contact with the first side surface and the second side surface, the third diamond semiconductor containing nitrogen, a first electrode electrically connected to the first diamond semiconductor layer, and a second electrode electrically connected to the second diamond semiconductor layer.

FIG. 1 is a schematic cross-sectional diagram of a semiconductor device 100 according to the embodiment. The semiconductor device 100 according to the embodiment is a PIN diode.

The semiconductor device 100 is configured to include a drift layer (first diamond semiconductor layer) 10, a cathode layer (second diamond semiconductor layer) 12, a semiconductor layer (third diamond semiconductor layer) 14, an anode layer (semiconductor layer) 16, a contact layer (fifth diamond semiconductor layer) 20, an insulating layer 30, an anode electrode (first electrode) 40, and a cathode electrode (second electrode) 42.

The semiconductor device 100 is configured to include an anode electrode 40, an anode layer 16, a drift layer 10, a semiconductor layer 14, an insulating layer 30, a cathode layer 12, a contact layer 20, and a cathode electrode 42. The shape of the drift layer 10, the cathode layer 12 and the contact layer 20 is a mesa structure. The drift layer 10 has a side surface (first side surface) 10a in a portion of the mesa structure. The drift layer 10 has a side surface 100a in a portion that is not the mesa structure. The drift layer 10 has a top surface 10b. The cathode layer 12 has a side surface (second side surface) 12a in a portion of the mesa structure. The contact layer 20 has a side surface 20a in a portion of the mesa structure.

The conductivity type of the drift layer 10 is an i type or a p type. The p-type impurity used for the drift layer 10 is, for example, boron (B). In order to increase the breakdown voltage, the impurity concentration of the drift layer 10 is preferably $1 \times 10^{13}$ atoms/cm$^3$ or more and $5 \times 10^{16}$ atoms/cm$^3$ or less.

The cathode layer 12 is provided on the drift layer 10. The conductivity type of the cathode layer 12 is an n type. The n-type impurity used for the diamond semiconductor layer is, for example, phosphorus (P). In order to reduce the on-resistance, the n-type impurity concentration in the cathode layer 12 is preferably $1 \times 10^{18}$ atoms/cm$^3$ or more.

The contact layer 20 is provided on the cathode layer 12. The conductivity type of the contact layer 20 is an type. In order to reduce the contact resistance between the cathode electrode 42 and the contact layer 20, the n-type impurity concentration in the contact layer 20 is preferably $1 \times 10^{19}$ atoms/cm$^3$ or more and $1 \times 10^{22}$ atoms/cm$^3$ or less.

The mesa structure 50 is configured include the drift layer 10, the cathode layer 12, and the contact layer 20 above the anode layer 16. The side surface 50a of the mesa structure is configured with the side surface 10a of the drift layer, the side surface 12a of the cathode layer, and the side surface 20a of the contact layer. The top surface 20b of the contact layer is the top surface 50b of the mesa structure. The top surface 10b of the drift layer is a surface provided around the mesa structure 50. Note that, the side surface 10a of the drift layer and the side surface 12a of the cathode layer are not limited to the side surfaces of the mesa structure.

The semiconductor layer 14 is provided on the top surface 10b of the drift layer, the side surface 10a of the drift layer, the side surface 12a of the cathode layer, the side surface 20a of the contact layer, and the top surface 20b of the contact layer. The semiconductor layer 14 is in contact with, for example, interfaces of the top surface 10b of the drift layer, the side surface 10a of the drift layer, the side surface 12a of the cathode layer, the side surface 20a of the contact layer, and the top surface 20b of the contact layer.

The semiconductor layer 14 is a diamond semiconductor layer containing nitrogen (N). The concentration of nitrogen (N) in the semiconductor layer 14 is preferably $1 \times 10^{15}$ atoms/cm$^3$ or more and $1 \times 10^{19}$ atoms/cm$^3$ or less in order to facilitate doping and to control the conductivity of the semiconductor layer 14. The film thickness of the semiconductor layer 14 is preferably 10 nm or more and 10 μm or less in order to improve the planarization of the surface roughened by etching or the like for forming the mesa structure 50 and is preferably 100 nm or more and 10 μm or less in order to secure the insulating property.

The drift layer 10 is provided between the anode layer 16 and the cathode layer 12. In other words, the drift layer 10 is provided on the anode layer 16. The conductivity type of the anode layer 16 is a p type. In order to reduce the contact resistance between the anode electrode 40 and the anode layer 16, the impurity concentration of the anode layer 16 is preferably higher than the impurity concentration of the drift layer and is preferably $10^{18}$ atoms/cm$^3$ or more.

The anode layer 16 is preferably a diamond semiconductor layer in order to reduce lattice distortion between the anode layer 16 and the drift layer 10. In addition, the anode layer 16 may be an Si (silicon) substrate or an SiC (silicon carbide) substrate.

The insulating layer 30 is provided on the semiconductor layer 14 so as to be in contact with the semiconductor layer 14. The insulating layer 30 is preferably an oxide including a silicon oxide such as $SiO_2$ or an aluminum oxide such as $Al_2O_3$ or a nitride including an aluminum nitride such as AlN or a silicon nitride such as SiN in terms of a good insulating property.

For the formation of the insulating layer 30, for example, a CVD (Chemical Vapor Deposition) method is used. However, for example, after depositing a layer made of, Si (silicon) or Al (aluminum), heat treatment is performed in an oxygen gas ($O_2$ gas) atmosphere, a nitrogen gas ($N_2$ gas) atmosphere, or a water vapor atmosphere, so that the insulating layer 30 may be formed.

The anode electrode 40 is electrically connected to the drift layer 10 through the anode layer 16. It is preferable that the anode electrode 40 is in ohmic contact with the anode layer 16. For example, an electrode formed by depositing an electrode where Ti (titanium)/Pt (platinum)/Au (gold) is stacked by using an electron beam and performing heat treatment in an Ar (argon) gas atmosphere is a good ohmic electrode for the diamond semiconductor layer. Therefore, in the case where the anode layer 16 is a diamond semiconductor layer, the electrode where Ti (titanium)/Pt (platinum)/Au (gold) is stacked can be preferably used as the anode electrode 40. Furthermore, graphite or metal carbide may be used as a material of the anode electrode 40.

As illustrated in FIG. 1, the drift layer 10 may be provided between the anode layer 16 and the cathode layer 12 under the anode layer 16. In addition, the anode electrode 40 may have a vertical structure where, for example, one end is provided on the insulating layer 30 and the other end is electrically connected to the drift layer 10 or the anode layer 16.

The cathode electrode 42 is provided on the contact layer 20 and is electrically connected to the cathode layer 12 via the contact layer 20. The cathode electrode 42 is preferably an electrode formed by depositing an electrode where the Ti (titanium)/Pt (platinum)/Au (gold) is stacked by using an electron beam and performing heat treatment in an Ar (argon) gas atmosphere in order to form a good junction with the contact layer 20 or the cathode layer 12. Furthermore, graphite or metal carbide may be used as a material of the cathode electrode 42.

The cathode electrode 42 has a first field plate region 44 provided on the insulating layer 30. Due to the presence of the first field plate region 44, the electric field concentration in the semiconductor device 100 is relaxed.

Next, a method of manufacturing the semiconductor device 100 according to the embodiment will be described. FIGS. 2A to 2E are schematic cross-sectional diagrams illustrating the method of manufacturing the semiconductor device 100 according to the embodiment.

The method of manufacturing the semiconductor device 100 according to the embodiment is, forming an i-type or p-type drift layer 10 on a p-type anode layer 16, forming an n-type cathode layer 12 on the drift layer 10, forming an n$^+$-type contact layer 20 on the cathode layer 12, forming a mesa structure including the drift layer 10, the cathode layer 12, and the contact layer 20 on the drift layer 10, forming a semiconductor layer 14 on the drift layer 10, the cathode layer 12, and the contact layer 20, forming an insulating layer 30 on the semiconductor layer 14, forming an anode electrode 40 electrically connected to the drift layer 10, forming a cathode electrode 42 electrically connected to the cathode layer 12, and forming a first field plate region 44 on the insulating layer 30.

First, the i-type or p-type drift layer 10 is formed on the p-type anode layer 16 by, for example, an epitaxial growth method. As the anode layer 16, for example, a diamond semiconductor substrate doped with boron as a p-type impurity is preferably used. In addition, an Si substrate or the like may be used as the anode layer 16.

Figure 2A:
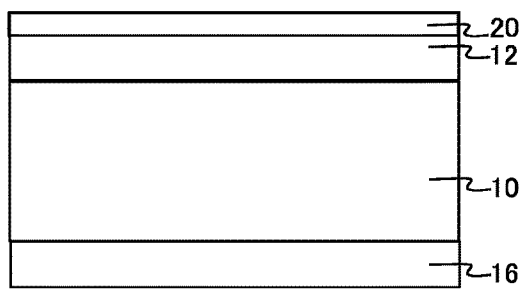
FIGS. 2A to 2E are schematic cross-sectional diagrams illustrating a method of manufacturing the semiconductor device of the first embodiment.

Next, the n-type cathode layer 12 is formed on the drift layer 10 by, for example, an epitaxial growth method. Next, the n$^+$-type contact layer 20 is formed on the cathode layer 12 by, for example, an epitaxial growth method (FIG. 2A).

For the epitaxial growth of the diamond semiconductor layer in the manufacturing method according to the embodiment, a microwave plasma CVD (Chemical Vapor Deposition) method is preferably used.

In a diamond semiconductor, it is difficult to perform impurity doping on the diamond semiconductor by using ion implantation or solid phase diffusion. Therefore, in the formation of the diamond semiconductor layer, doping is generally performed at the time of forming the diamond semiconductor layer.

As source gases for forming the p-type diamond semiconductor layer in the embodiment, $H_2$ (hydrogen) gas, $CH_4$ (methane) gas, and $B_2H_6$ (diborane) gas as a p-type impurity gas are preferably used. In addition, as source gases for forming the n-type diamond semiconductor layer in the embodiment, $H_2$ (hydrogen) gas, $CH_4$ (methane) gas, and $PH_3$ (phosphine) gas as an n-type impurity gas are preferably used. It is also preferable to control the α parameter by controlling the ratio of $CH_4$ gas to $H_2$ gas.

Next, the mesa structure 50 including the drift layer 10, the cathode layer 12, and the contact layer 20 is formed on the drift layer 10 by removing portions of the drift layer 10, the cathode layer 12, and the contact layer 20 by, for example, a photolithography method and an RIE (Reactive Ion Etching) method. Aside surface 10a of the drift layer, a side surface 12a of the cathode layer, and a side surface 20a of the contact layer formed at this time constitute a side surface 50a of the mesa structure. In addition, a top surface 20b of the contact layer constitutes a top surface 50b of the mesa structure. Furthermore, at this time, a top surface 10b of the drift layer is formed on the drift layer 10 around the mesa structure 50 (FIG. 2B).

Next, the semiconductor layer 14 is formed on the drift layer 10, the cathode layer 12, and the contact layer 20 by, for example, an epitaxial growth method. Herein, as source gases for forming the semiconductor layer 14, $H_2$ (hydrogen) gas, $CH_4$ (methane) gas, and a nitrogen source gas are preferably used. Herein, as a nitrogen source gas, for example, $N_2$ gas, $NH_3$ gas, or the like may be preferably used.

Figure 2D:
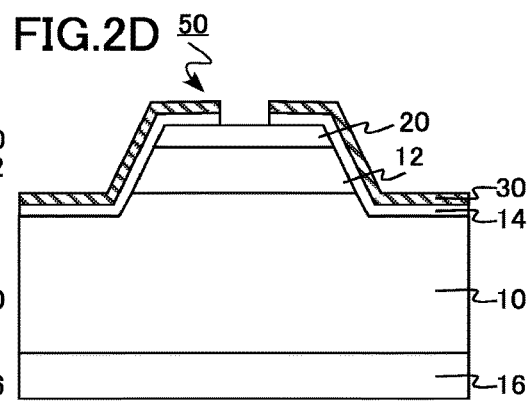
Figure 2B:
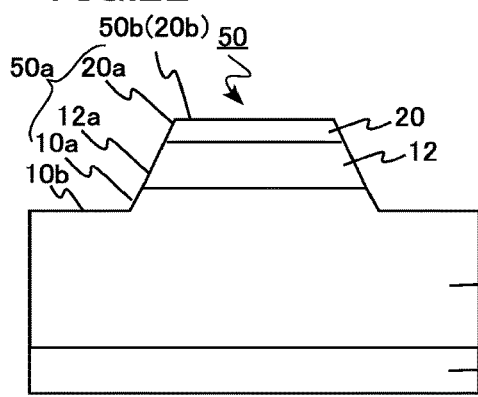
Figure 2E:
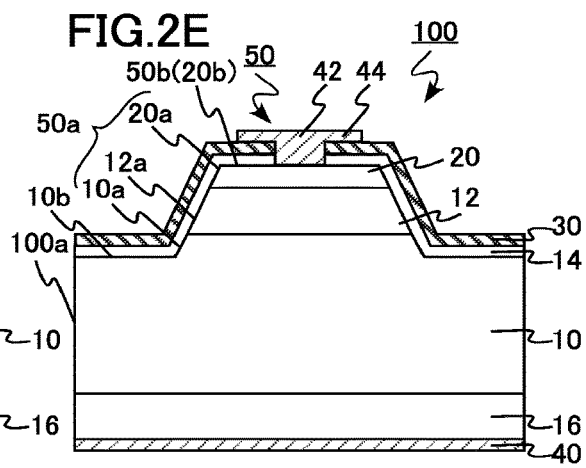
Figure 2C:
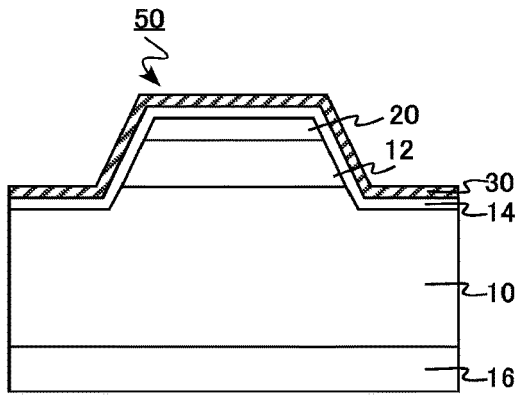

Next, the insulating layer 30 made of, for example, $SiO_2$ is formed on the semiconductor layer 14 by, for example, a CVD method (FIG. 2C).

Next, a portion of the semiconductor layer 14 and a portion of the insulating layer 30 are removed by patterning and etching so that the contact layer 20 is exposed (FIG. 2D).

Next, the anode electrode 40 electrically connected to the drift layer 10 and the cathode electrode 42 electrically connected to the cathode layer 12 are formed by depositing Ti/Pt/Au by electron beam evaporation and, after that, performing heat treatment at 600° C., and the first field plate region 44 is formed on the insulating layer 30, so that the semiconductor device 100 according to the embodiment is obtained (FIG. 2E).

The impurity concentrations of the semiconductor device 100 manufactured by the above method were measured by secondary ion mass spectrometry (SIMS). The B concentration in the diamond semiconductor substrate used as the anode layer 16 was $5 \times 10^{20}$ cm$^{-3}$, the P and B concentrations in the drift layer 10 were the detection limit ($1 \times 10^{15}$ cm$^{-3}$) or less, the P concentration in the cathode layer 12 was $1 \times 10^{18}$ cm$^{-3}$, the N concentration in the semiconductor layer 14 was $1 \times 10^{17}$ cm$^{-3}$, and the P concentration in the contact layer 20 was $1 \times 10^{20}$ cm$^{-2}$.

IV characteristics of the semiconductor device 100 were measured. A rectification ratio at ±10 V was a number having ten digits or more, and a forward current density at 5 V was 1000 A/cm$^2$. In addition, even if a reverse voltage up to 10 kV was applied, breakdown did not occur.

Next, the functions and effects of the semiconductor device 100 according to the embodiment will be described.

Like the semiconductor device according to the embodiment, by providing the nitrogen-containing layer on the side surface of the semiconductor layer, the layer becomes an insulating layer with excellent adhesion, and a semiconductor device with high reliability and high breakdown voltage can be provided.

Hereinafter, the functions and effects will be described more in detail.

Generally, in the PIN diode, the reverse breakdown voltage is determined by characteristics of a depletion layer formed in the pn junction. Therefore, it is possible to manufacture a diode that maintains a high dielectric breakdown electric field inherent in diamond. With respect to the forward current of the PIN diode, not only the effect of high mobility exhibited by diamond but also the effect of conductivity modulation can be expected. Therefore, in the PIN diode using a diamond semiconductor, even in the case where the film thickness of the drift layer 10 is large, a low resistance diode can be expected.

In addition, with respect to a diamond, n-type doping has been a long-standing problem. However, by doping phosphorus (P) as an n-type impurity, an n-type diamond semiconductor with a relatively low resistance can be realized and controlled even at room temperature.

However, the surface of the diamond is stabilized by bonding with different elements such as oxygen and hydrogen. Therefore, although it varies with the termination state, in general, the surface level density is high. As a result, the surface leakage and the electric field concentration easily occur, and it difficult to manufacture a device with a high breakdown voltage that exhibits the dielectric breakdown electric field inherent in diamond. In addition, since it is difficult to use wet etching for diamond, dry etching is used. It is considered that large damage is applied to the diamond by this dry etching. Furthermore, particularly in the case of n-type diamond doped with P, if P is doped at a high concentration, the surface planarization is easily deteriorated due to hillocks, abnormally grown particles, or the like. Therefore, the planarization of the surface after etching is also easily deteriorated.

In order to relax the electric field and control the operation of the semiconductor device 100, insulating layers are used for various portions. Since the semiconductor device 100 using a diamond semiconductor is expected to be used in the field of high breakdown voltage, a high breakdown voltage is also required for the insulating layer. Herein, the breakdown voltage of the insulating layer depends on the film quality. However, even with respect to the $SiO_2$ film which is considered to have high quality formed by thermal oxidation, the breakdown voltage is 10 MV/cm, which is equal to the breakdown voltage of diamond or is lower than the breakdown voltage of diamond. Therefore, in order to use an insulating layer with a high breakdown voltage, it is preferable that the film thickness is relatively thick and the quality is high.

However, if an insulating layer such as an oxide film is directly formed on the surface of the diamond, adhesion is poor, and thus, there is a problem that removing occurs if the oxide film having a sufficient thickness that can be used for high breakdown voltage applications is formed.

Therefore, the semiconductor device 100 according to the embodiment is configured to include the semiconductor layer 14 containing nitrogen (N) which is in contact with the side surface 10a of the i-type or p-type drift layer and the side surface 12a of the n-type cathode layer. The donor level of nitrogen (N) is 1.7 eV, which is much deeper than 0.58 eV of phosphorus (P). Therefore, since the semiconductor layer is a very high resistance at room temperature, the semiconductor layer 14 can be used as a good insulating layer.

In addition, while the atomic number of phosphorus (P) is 15, the atomic number of nitrogen (N) is 7, which is close to the atomic number 6 of carbon (C). Therefore, since nitrogen atom and carbon atom are close to each other in size, the nitrogen atom and the carbon atom can be easily replaced with each other. Therefore, while the incorporation efficiency of phosphorus (P) and the controllability of the impurity concentration are improved by growing the diamond containing phosphorus (P) in the direction of <111>, growth and doping concentration of the diamond semiconductor layer containing nitrogen (N) can be easily performed independently of the plane orientation of the growth. Therefore, the semiconductor layer 14 containing nitrogen (N) can be epitaxially grown even on a surface having irregularities such as the side surface 50a of the mesa structure and the top surface 50b of the mesa structure, and the semiconductor layer exhibits a good adhesion.

Furthermore, on the outermost surfaces of PN junctions, mesa structures, and the like, the density of interface states formed at the time of dry etching is high. Since adhesion is poor as described above, it is difficult to provide the insulating layer 30 directly on the outermost surface. However, due to the semiconductor layer 14, it is possible to reduce the density of interface states on the side surface of the semiconductor device 100 where a pn junction end contributing to most of the electric field applied to the semiconductor device 100 is exposed, and it is possible to obtain the effect of relaxing the electric field concentration and to reduce the leak current in the pn junction.

Furthermore, the semiconductor layer 14 also functions as an n⁻-type semiconductor layer having a low activation rate. Therefore, by providing the semiconductor layer 14, the effect of widening the depletion layer and increasing the breakdown voltage can be expected.

Furthermore, in the semiconductor device 100 according to the embodiment, it is preferable to provide the insulating layer 30 having another composition in contact with the semiconductor layer 14 in order to further improve the breakdown voltage. Since phosphorus atom is larger than carbon atom, in diamond containing phosphorus (P), segregation of phosphorus or the like easily occurs so that distortion easily occurs. Therefore, in the case of containing phosphorus (P), it is difficult to control the surface planarization. However, as described above, since nitrogen atom and carbon atom are close to each other in size, distortion hardly occurs in the crystal, and thus, the surface can be easily planarized. Therefore, on the semiconductor layer 14, it is possible to provide the insulating layer 30 with a high quality and a large film thickness.

As described above, as the material of the insulating layer 30, for example, a silicon oxide, an aluminum oxide, an aluminum nitride, or a silicon nitride may be used. The aluminum nitride has a high dielectric strength and has a high affinity since the semiconductor layer 14 contains nitrogen, and thus, the aluminum nitride is preferred.

Furthermore, in the semiconductor device 100 according to the embodiment, it is preferable that the second electrode 42 has the first field plate region 44 provided on the insulating layer 30. By providing the insulating layer 30 via the semiconductor layer 14, it is possible to form the insulating layer 30 having a sufficient film thickness that can be used with a high adhesion and a high breakdown voltage. Therefore, by disposing the first field plate region 44 on the insulating layer 30, the electric field concentration of the semiconductor device 100 is relaxed, so it is possible to provide the semiconductor device 100 with a high breakdown voltage.

As described above, according to the semiconductor device 100 according to the embodiment, it is possible to provide a semiconductor device with a high breakdown voltage.

Second Embodiment

A semiconductor device 200 according to a second embodiment is different from the semiconductor device 100 according to the first embodiment in terms that the semiconductor device 200 is configured to further include a first-conductivity-type fourth diamond semiconductor layer 18 provided on the second diamond semiconductor layer 12, and a third electrode 46 electrically connected to the fourth diamond semiconductor layer 18. Herein, redundant description of the first embodiment will be omitted.

Figure 3:
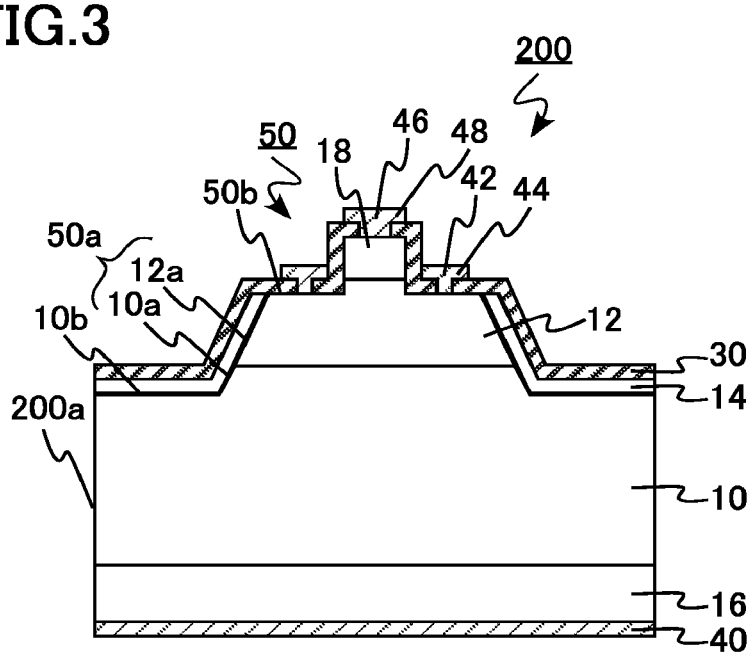
FIG. 3 is a schematic cross-sectional diagram of the semiconductor device of the second embodiment.

FIG. 3 is a schematic cross-sectional diagram of the semiconductor device 200 according to the embodiment. The semiconductor device 200 according to the embodiment is a bipolar transistor. The semiconductor device 200 is configured to include a drift layer (first diamond semiconductor layer) 10, a base layer (second diamond semiconductor layer) 12, a semiconductor layer (third diamond semiconductor layer) 14, a collector layer (semiconductor layer) 16, an emitter layer (fourth diamond semiconductor layer) 18, an insulating layer 30, a collector electrode (first electrode) 40, a base electrode (second electrode) 42, an emitter electrode (third electrode) 46.

The base electrode 42 has a first field plate region 44. The emitter electrode 46 has a second field plate region 48.

The semiconductor device 200 has a side surface 200a of the semiconductor device extending across the anode electrode 40, the anode layer 16, the drift layer 10, the semiconductor layer 14, and the insulating layer 30.

The emitter layer 18 is provided on the base layer 12. The conductivity type of the emitter layer 18 is a p type. The p-type impurity used for the emitter layer 18 is, for example, boron (B).

The emitter electrode 46 is provided on the emitter layer 18 and is electrically connected to the emitter layer 18. The emitter electrode 46 is preferably an electrode formed by depositing an electrode configured with the Ti (titanium)/Pt (platinum)/Au (gold) by using an electron beam and performing heat treatment in an Ar (argon) gas atmosphere in order to form a good junction with the emitter layer 18. Furthermore, graphite or metal carbide may be used as a material of the emitter electrode 46.

The base electrode 42 has a first field plate region 44 provided on the insulating layer 30. In addition, the emitter electrode 46 has a second field plate region 48 provided on the insulating layer 30. The first field plate region 44 and the second field plate region 48 are used for relaxing the electric field concentration in the semiconductor device 200.

Next, a method of manufacturing the semiconductor device 200 according to the embodiment will be described. FIGS. 4A to 4F are schematic cross-sectional diagrams illustrating the method of manufacturing the semiconductor device 200 according to the embodiment.

In the method of manufacturing the semiconductor device 200 according to the embodiment, forming the i-type or p-type drift layer 10 on the p-type collector layer 16, forming the n-type base layer 12 on the drift layer 10, forming the p-type emitter layer 18 on the base layer 12, forming the mesa structure 50 including the drift layer 10, the base layer 12, and the emitter layer 18 on the drift layer 10, forming the semiconductor layer 14 on the drift layer 10 and the mesa structure 50, forming the insulating layer 30 on the semiconductor layer 14, forming the collector electrode 40 electrically connected to the drift layer 10, forming the base electrode 42 electrically connected to the base layer 12, forming the emitter electrode 46 electrically connected to the emitter layer 18, and forming the first field plate region 44 and the second field plate region 48 on the insulating layer 30.

First, the i-type or p-type drift layer 10 is formed on the p-type collector layer 16 by, for example, an epitaxial growth method. The collector layer 16 is, for example, a diamond semiconductor substrate doped with boron as a p-type impurity. An Si substrate or the like may be used as the collector layer 16.

Next, the n-type base layer 12 is formed on the drift layer 10 by, for example, an epitaxial growth method. Next, the p-type emitter layer 18 is formed on the base layer 12 by, for example, an epitaxial growth method (FIG. 4A).

Next, the mesa structure 50 including the drift layer 10, the base layer 12, and the emitter layer 18 is formed on the drift layer 10 by removing portions of the drift layer 10, the base layer 12, and the emitter layer 18 by, for example, a photolithography method and a reactive ion etching (RIE) method (FIG. 4B).

Next, the semiconductor layer 14 is formed on the top surface 10b of the drift layer, the side surface 50a of a portion of the mesa structure, and the top surface 50b of the mesa structure by, for example, by an epitaxial growth method (FIG. 4C). Herein, as source gases for forming the semiconductor layer 14, $H_2$ (hydrogen) gas, $CH_4$ (methane) gas, and a nitrogen source gas are used. As the nitrogen source gas, for example, $N_2$ gas or $NH_3$ gas is used.

Next, a portion of the base layer 12, a portion of the semiconductor layer 14, and a portion of the emitter layer 18 are removed by, for example, patterning and etching so that the portion of the base layer 12 and the emitter layer 18 are exposed (FIG. 4D).

Next, the insulating layer 30 made of, for example, $SiO_2$ is formed on the semiconductor layer 14, the base layer 12, and the emitter layer 18 by, for example, a CVD method. Next, a portion of the insulating layer 30 is removed by, for example, patterning and etching so that a portion of the surface of the base layer 12 and a portion of the surface of the emitter layer 18 are exposed (FIG. 4E).

Next, the collector electrode 40 electrically connected to the drift layer 10, the base electrode 42 electrically connected to the base layer 12, and the emitter electrode 46 electrically connected to the emitter layer 18 are formed by depositing Ti/Pt/Au by electron beam vapor deposition and, after that, performing heat treatment at 600° C., and the first field plate region 44 and the second field plate region 48 are formed on the insulating layer 30, so that the semiconductor device 200 according to the embodiment is obtained (FIG. 4F).

The impurity concentrations of the semiconductor device 200 manufactured by the above method were measured by SIMS (Secondary Ion Mass Spectrometry). The B concentration in the diamond semiconductor substrate used as the collector layer 16 was $5\times10^{20}$ cm$^{-3}$, the P and B concentrations in the drift layer 10 were the detection limit ($1\times10^{15}$ cm$^{-3}$) or less, the P concentration in the base layer 12 is $1\times10^{18}$ cm$^{-3}$, the N concentration in the semiconductor layer 14 is $1\times10^{17}$ cm$^{-3}$, and the P concentration in the emitter layer 18 was $1\times10^{20}$ cm$^{-3}$. IV characteristics of the semiconductor device were measured. A rectification ratio at ±10 V was a number having ten digits or more, and a forward current density at 5 V was 1000 A/cm$^2$. In addition, even if a reverse voltage up to 10 kV was applied, breakdown did not occur.

As described above, according to the semiconductor device 200 according to the embodiment, it is possible to provide a semiconductor device with a high breakdown voltage.

Third Embodiment

A semiconductor device 300 according to a third embodiment is configured to include a first-conductivity-type first diamond semiconductor layer 10, a second diamond semiconductor layer 12 being in contact with the first diamond semiconductor layer 10 and containing nitrogen, a first electrode 40 electrically connected to the first diamond semiconductor layer 10, and a second electrode 42 being in contact with the first diamond semiconductor layer 10 and the second diamond semiconductor layer 12.

The semiconductor device 300 according to the embodiment is a Schottky diode. Herein, redundant description of the first and second embodiments will be omitted.

Figure 5:
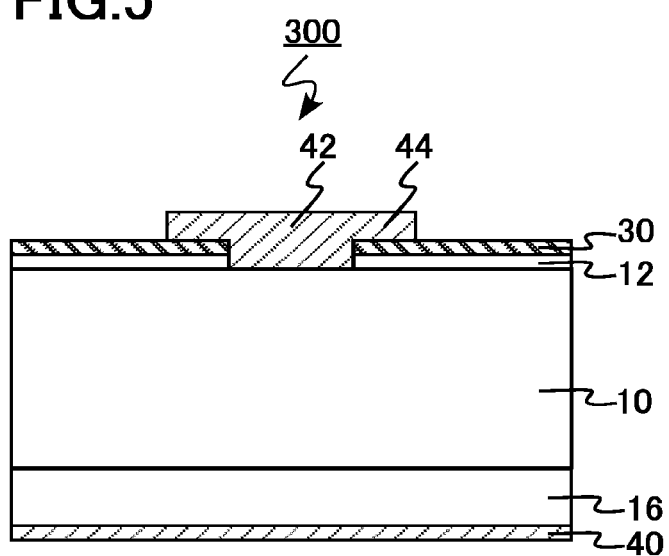
FIG. 5 is a schematic sectional view of the semiconductor device of the third embodiment.

FIG. 5 is a schematic cross-sectional diagram of the semiconductor device 300 according to the embodiment. The semiconductor device 300 is configured to include a drift layer (first diamond semiconductor layer) 10, a semiconductor layer (second diamond semiconductor layer) 12, an anode layer (semiconductor layer) 16, an insulating layer 30, an anode electrode (first electrode) 40, and a cathode electrode (second electrode) 42.

The conductivity type of the drift layer 10 is a p$^-$ type. The drift layer 10 is a drift layer of a Schottky diode. The p-type impurity used for the drift layer 10 is, for example, boron (B). The impurity concentration of the drift layer 10 is preferably $5\times10^{16}$ atoms/cm$^3$ or less in order to increase the breakdown voltage.

The semiconductor layer 12 is provided to be in contact with the drift layer 10 on the drift layer 10. The semiconductor layer 12 contains nitrogen (N). The concentration of nitrogen (N) in the semiconductor layer 12 is preferably $1\times10^{15}$ atoms/cm$^3$ or more and $1\times10^{19}$ atoms/cm$^3$ or less in order to facilitate doping and to control the conductivity of the semiconductor layer 12. The film thickness of the semiconductor layer 12 is preferably 10 nm or more in order to improve the planarization of the surface of the drift layer 10 and is preferably 100 nm or more in order to secure the insulating property.

The insulating layer 30 is provided on the semiconductor layer 12 so as to be in contact with the semiconductor layer 12. The insulating layer 30 is preferably an oxide film including a silicon oxide such as $SiO_2$ or an aluminum oxide such as $Al_2O_3$ or a nitride film containing an aluminum nitride such as AlN or a silicon nitride such as SiN in terms of formation of the insulating layer 30 with a good insulating property.

The drift layer 10 is provided between the anode layer 16 and the semiconductor layer 12. In other words, the drift layer 10 is provided on the anode layer 16. The conductivity type of the anode layer 16 is a p type. The impurity concentration of the anode layer 16 is preferably higher than the impurity concentration of the drift layer 10 so as to reduce the on-resistance, and the impurity concentration of the anode layer 16 is preferably $10^{18}$ atoms/cm$^3$ or more.

The anode layer 16 is preferably a diamond semiconductor layer containing diamond in order to reduce lattice distortion between the diamond semiconductor layer and the drift layer 10. As the anode layer 16, a semiconductor layer containing Si such as an Si (silicon) substrate may also be preferably used.

Herein, in a Schottky diode using an n-type diamond semiconductor, since the Schottky barrier is high, a high breakdown voltage can be maintained. However, the Schottky barrier is as high as 4 eV or more, and it is difficult to manufacture an ohmic electrode for an n-type diamond semiconductor. Therefore, the semiconductor device 300 according to the embodiment is preferably a Schottky diode using a p-type diamond semiconductor. Namely, it is preferable that the conductivity types of the drift layer 10 and the anode layer 16 are a p type.

The anode electrode 40 is provided so that the anode layer 16 is provided between the anode electrode 40 and the drift layer 10. In other words, the anode layer 16 is provided on the anode electrode 40. The anode electrode 40 is electrically connected to the drift layer 10 via the anode layer 16.

It is preferable that the anode electrode 40 is in ohmic contact with the anode layer 16. For example, an electrode formed by depositing an electrode configured with Ti (titanium)/Pt (platinum)/Au (gold) by using an electron beam and performing heat treatment in an Ar (argon) gas atmosphere is a good ohmic electrode for the diamond semiconductor layer. Therefore, in the case where the anode layer 16 is a diamond semiconductor layer, the electrode configured with Ti (titanium)/Pt (platinum)/Au (gold) is preferable as the anode electrode 40. Furthermore, graphite or metal carbide may be used as a material of the anode electrode 40. As illustrated in FIG. 5, the anode electrode 40 may be provided under the anode layer 16 and, for example, may be formed to have a pseudo-vertical structure where one end may be provided on the insulating layer 30, and the other end may be electrically connected to the drift layer 10 or the anode layer 16.

The cathode electrode 42 is provided on the drift layer 10. The cathode electrode 42 is electrically connected to the drift layer 10 and is in contact with the semiconductor layer 12. The cathode electrode 42 is a Schottky electrode. The cathode electrode 42 is preferably contains at least one kind of a metal selected from a first group including Ni (nickel), Ti (titanium), Al (aluminum), Pt (platinum), Au (gold), Mo (molybdenum), Ru (ruthenium), and W (tungsten) in order to form a good electrode. Alternatively, the cathode electrode 42 may be a carbide containing at least one kind of a metal selected from the above-described first group.

The cathode electrode 42 has a first field plate electrode 44 provided on the insulating layer 30. The first field plate electrode 44 is used for relaxing the electric field concentration in the semiconductor device 300.

Next, a method of manufacturing the semiconductor device 300 according to the embodiment will be described.

FIGS. 6A to 6E are schematic cross-sectional diagrams illustrating a method of manufacturing the semiconductor device 300 according to the embodiment.

In the method of manufacturing the semiconductor device 300 according to the embodiment, forming the p-type drift layer 10 on the p-type anode layer 16, forming the semiconductor layer 12 on the drift layer 10, forming the insulating layer 30 on the semiconductor layer 12, forming the anode electrode 40 electrically connected to the drift layer 10, forming the cathode electrode 42 electrically connected to the drift layer 10, and forming the first field plate region 44 on the insulating layer 30.

Figure 6A:
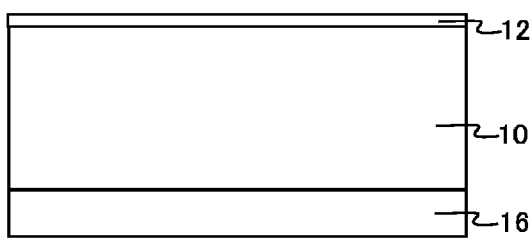
FIGS. 6A to 6E are schematic cross-sectional diagrams illustrating a method of manufacturing the semiconductor device of the third embodiment.

First, the p-type drift layer 10 is formed on the p-type anode layer 16, for example, by an epitaxial growth method. The anode layer 16 is, for example, a diamond semiconductor substrate doped with B (boron) as a p-type impurity. In addition, an Si substrate or the like may be used as the anode layer 16. Next, a semiconductor layer 12 is formed on the drift layer 10 by, for example, an epitaxial growth method (FIG. 6A). Herein, $H_2$ (hydrogen) gas, $CH_4$ (methane) gas, and nitrogen source gas are used as source gases for forming the semiconductor layer 12. The nitrogen source gas is, for example, $N_2$ gas or $NH_3$ gas.

Figure 6D:
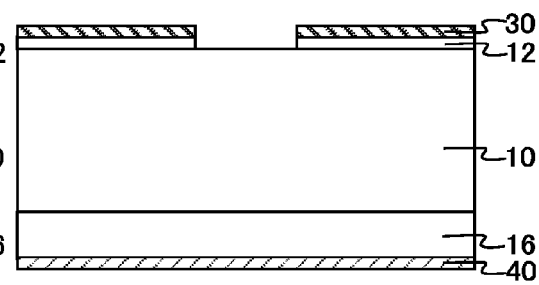
Figure 6B:
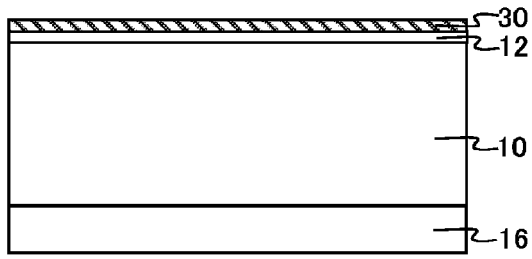

Next, the insulating layer 30 made of, for example, $SiO_2$ is formed on the semiconductor layer 12 by, for example, CVD method (FIG. 6B).

Next, the anode electrode 40 is formed by depositing Ti/Pt/Au by electron beam evaporation and, after that, by performing heat treatment at 600° C. (FIG. 6C).

Next, a portion of the semiconductor layer 12 and a portion of the insulating layer 30 are removed by patterning and etching so that the drift layer 10 is exposed (FIG. 6D).

Figure 6E:
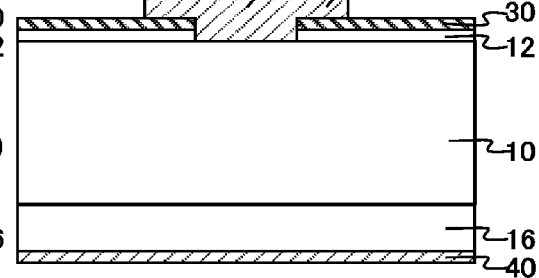
Figure 6C:
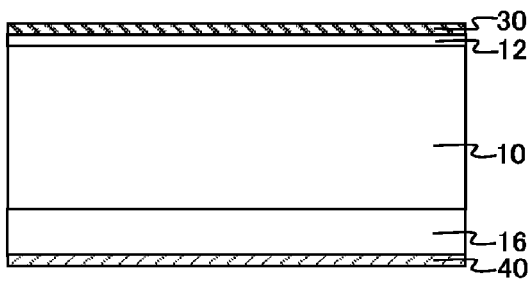

Next, the cathode electrode 42 is formed by depositing Ni by electron beam evaporation, and the first field plate region 44 is formed on the insulating layer 30, so that the semiconductor device 300 according to the embodiment is obtained (FIG. 6E).

Next, the functions and effects of the embodiment will be described.

Similarly to the case of the first embodiment, in the semiconductor layer 12 containing nitrogen (N), the donor level of nitrogen (N) is 1.7 eV, which is much deeper than 0.58 eV of phosphorus (P). Therefore, since the semiconductor layer has a very high resistance at room temperature, this semiconductor layer 12 can be used as a good insulating layer. In addition, the semiconductor layer 12 containing nitrogen (N) can be epitaxially grown and exhibits a good adhesion to the semiconductor layer.

Furthermore, in the semiconductor device 300 according to the embodiment, it is preferable to provide the insulating layer 30 having another composition in contact with the semiconductor layer 12 in order to further improve the breakdown voltage. Since phosphorus atom is larger than carbon atom, in diamond containing phosphorus (P), segregation of phosphorus or the like easily occurs so that distortion easily occurs. Therefore, in the case of containing phosphorus (P), it is difficult to control the surface planarization. However, as described above, since nitrogen atom and carbon atom are close to each other in size, distortion hardly occurs in the crystal, and thus, the surface can be easily planarized. Therefore, on the semiconductor layer 14, it is possible to provide the insulating layer 30 with a high quality and a large film thickness. In addition, as described above, as the material of the insulating layer 30, for example, a silicon oxide, an aluminum oxide, an aluminum nitride, or a silicon nitride may be used. The aluminum nitride has a high dielectric strength and has a high affinity since the semiconductor layer 12 contains nitrogen, and thus, the aluminum nitride is preferred.

In particular, in a Schottky diode using a diamond semiconductor like the embodiment, the electric field concentration occurs at an end portion of the cathode electrode 42 and in the vicinity of the cathode electrode 42. By using the semiconductor layer 12 containing nitrogen (N), the semiconductor layer 12 functions as an $n^-$-type semiconductor layer having a low activation rate. Therefore, by providing the semiconductor layer 12, it is possible to widen the depletion layer and to increase the breakdown voltage.

Furthermore, in the semiconductor device 300 according to the embodiment, it is preferable to provide the insulating layer 30 having another composition in contact with the semiconductor layer 12 in order to further improve the breakdown voltage. Since phosphorus atom is larger than carbon atom, in diamond containing phosphorus (P), segregation of phosphorus or the like easily occurs, and thus distortion easily occurs. Therefore, in the case of containing phosphorus (P), it is difficult to control the surface planarization. However, as described above, since nitrogen atom and carbon atom are close to each other in size, distortion hardly occurs in the crystal, and thus, the surface can be easily planarized. Therefore, on the semiconductor layer 14, it is possible to provide the insulating layer 30 with a high quality and a large film thickness. As described above, as the material of the insulating layer 30, for example, a silicon oxide, an aluminum oxide, an aluminum nitride, or a silicon nitride may be used. The aluminum nitride has a high dielectric strength and has a high affinity since the semiconductor layer 12 contains nitrogen, and thus, the aluminum nitride is preferred.

As described above, according to the semiconductor device 300 according to the embodiment, it is possible to provide a semiconductor device with a high breakdown voltage.

According to a semiconductor device of at least one embodiment described above, a semiconductor device is configured to include an i-type or first-conductivity-type first diamond semiconductor layer having a first side surface, a second-conductivity-type second diamond semiconductor layer being provided on the first diamond semiconductor layer and having a second side surface, a third diamond semiconductor layer being in contact with the first side surface and the second side surface and containing nitrogen, a first electrode being electrically connected to the first diamond semiconductor layer, and a second electrode being electrically connected to the second diamond semiconductor layer, so that it is possible to a semiconductor device with a high breakdown voltage.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
    an i-type or first-conductivity-type first diamond semiconductor layer having a first side surface;
    a second-conductivity-type second diamond semiconductor layer provided on the first diamond semiconductor layer and having a second side surface, a shape of the first diamond semiconductor layer and the second diamond semiconductor layer being a mesa structure and the first diamond semiconductor layer having a upper surface around the mesa structure;
    a third diamond semiconductor layer being in contact with the first side surface and the second side surface, the third diamond semiconductor containing nitrogen, the third diamond semiconductor layer provided on the upper surface;
    an insulating layer being in contact with the third diamond semiconductor layer;
    a first electrode electrically connected to the first diamond semiconductor layer; and
    a second electrode electrically connected to the second diamond semiconductor layer.

2. The semiconductor device according to claim 1, wherein the insulating layer contains a silicon oxide, an aluminum oxide, an aluminum nitride, or a silicon nitride.

3. The semiconductor device according to claim 1, wherein the second electrode has a region provided on the insulating layer.

4. The semiconductor device according to claim 1, further comprising a first-conductivity-type semiconductor layer having a first-conductivity-type impurity concentration higher than a first-conductivity-type impurity concentration of the first diamond semiconductor layer,
    wherein the first diamond semiconductor layer is provided between the first-conductivity-type semiconductor layer and the second diamond semiconductor layer.

5. The semiconductor device according to claim 1, further comprising:
    a first-conductivity-type fourth diamond semiconductor layer being provided on the second diamond semiconductor layer; and
    a third electrode being electrically connected to the fourth diamond semiconductor layer.

6. A semiconductor device comprising:
    a first-conductivity-type first diamond semiconductor layer;
    a second diamond semiconductor layer provided on the first diamond semiconductor layer and containing nitrogen;
    a first electrode being electrically connected to the first diamond semiconductor layer; and
    a second electrode provided directly on the first diamond semiconductor layer, the second electrode being in contact with a first side surface of the second diamond semiconductor layer.

7. The semiconductor device according to claim 6, further comprising an insulating layer provided directly on the second diamond semiconductor layer and being in contact with the second diamond semiconductor layer.

8. The semiconductor device according to claim 7, wherein the insulating layer contains a silicon oxide, an aluminum oxide, an aluminum nitride, or a silicon nitride.

9. The semiconductor device according to claim 7, wherein the second electrode has a region being provided on the insulating layer.

10. The semiconductor device according to claim 6, further comprising a first-conductivity-type semiconductor layer having a first-conductivity-type impurity concentration higher than a first-conductivity-type impurity concentration of the first diamond semiconductor layer,
    wherein the first diamond semiconductor layer is provided between the first-conductivity-type semiconductor layer and the second diamond semiconductor layer.

11. The semiconductor device according to claim 10, wherein conductivity types of the first diamond semiconductor layer and the semiconductor layer are a p type.

12. The semiconductor device according to claim 1, wherein the concentration of nitrogen (N) in the third semiconductor layer is $1\times10^{15}$ atoms/cm$^3$ or more and $1\times10^{19}$ atoms/cm$^3$ or less.

13. The semiconductor device according to claim 1, wherein the first diamond semiconductor layer is unconnected with the insulating layer.

14. The semiconductor device according to claim 7, wherein the second electrode is in direct contact with a second side surface of the insulating layer.

15. The semiconductor device according to claim 9, wherein the region is provided directly on the insulating layer.

* * * * *